US011476350B2

(12) United States Patent
Fukasaku et al.

(10) Patent No.: US 11,476,350 B2
(45) Date of Patent: Oct. 18, 2022

(54) TRANSISTOR AND ELECTRONIC DEVICE

(71) Applicant: Sony Semiconductor Solutions Corporation, Kanagawa (JP)

(72) Inventors: Katsuhiko Fukasaku, Kanagawa (JP); Shinichi Miyake, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 51 days.

(21) Appl. No.: 16/628,610

(22) PCT Filed: May 31, 2018

(86) PCT No.: PCT/JP2018/020894
§ 371 (c)(1),
(2) Date: Jan. 3, 2020

(87) PCT Pub. No.: WO2019/012839
PCT Pub. Date: Jan. 17, 2019

(65) Prior Publication Data
US 2020/0161469 A1 May 21, 2020

(30) Foreign Application Priority Data

Jul. 12, 2017 (JP) .............................. JP2017-136118

(51) Int. Cl.
*H01L 29/06* (2006.01)
*H01L 29/66* (2006.01)
(Continued)

(52) U.S. Cl.
CPC ...... *H01L 29/66795* (2013.01); *H01L 21/822* (2013.01); *H01L 27/0248* (2013.01);
(Continued)

(58) Field of Classification Search
CPC . H01L 29/786; H01L 21/822; H01L 27/0248; H01L 27/04; H01L 29/086;
(Continued)

(56) References Cited

U.S. PATENT DOCUMENTS 10,141,311 B2 * 11/2018 Glass .............. H01L 21/823821
2005/0017304 A1 * 1/2005 Matsushita ......... H01L 29/7842
257/347
(Continued)

FOREIGN PATENT DOCUMENTS

| CN | 103022124 A | 4/2013 |
|---|---|---|
| CN | 106784005 A | 5/2017 |

(Continued)

*Primary Examiner* — Shouxiang Hu
(74) *Attorney, Agent, or Firm* — Michael Best & Friedrich LLP

(57) ABSTRACT

[Problem to be Solved] To provide a transistor and an electronic device whose characteristics are easier to control.

[Solution] A transistor including: a semiconductor substrate; an insulating layer provided on the semiconductor substrate; a semiconductor layer provided on the insulating layer in a protruding manner; and a gate electrode provided over a portion of the insulating layer on the semiconductor layer and the insulating layer. A middle portion of a channel region of the semiconductor layer covered by the gate electrode is provided in a shape different from a shape of at least one of ends of the channel region of the semiconductor layer.

12 Claims, 9 Drawing Sheets

(51) Int. Cl.
  *H01L 21/822* (2006.01)
  *H01L 27/02* (2006.01)
  *H01L 27/04* (2006.01)
  *H01L 29/08* (2006.01)
  *H01L 29/423* (2006.01)
  *H01L 29/786* (2006.01)

(52) U.S. Cl.
  CPC ............ *H01L 27/04* (2013.01); *H01L 29/086* (2013.01); *H01L 29/42384* (2013.01); *H01L 29/786* (2013.01)

(58) Field of Classification Search
  CPC ......... H01L 29/42384; H01L 29/66795; H01L 27/0266; H01L 29/7853; H01L 29/785; H01L 29/78; H01L 29/66818; H01L 27/0886; H01L 27/0924; H01L 27/1211; H01L 29/1054
  See application file for complete search history.

(56) References Cited

U.S. PATENT DOCUMENTS

| | | | |
|---|---|---|---|
| 2010/0187575 A1 | 7/2010 | Baumgartner | |
| 2015/0137262 A1* | 5/2015 | Baek | H01L 27/0207 257/401 |
| 2015/0228721 A1* | 8/2015 | Lin | H01L 29/205 257/192 |

FOREIGN PATENT DOCUMENTS

| | | |
|---|---|---|
| JP | 06-334181 A | 12/1994 |
| JP | 2002-009289 A | 1/2002 |
| JP | 2003-298063 A | 10/2003 |
| JP | 2005-317851 A | 11/2005 |
| JP | 2007-053316 A | 3/2007 |
| JP | 2008-192819 A | 8/2008 |
| JP | 2008-300384 A | 12/2008 |
| JP | 2009-158711 A | 7/2009 |
| TW | 201513356 A | 4/2015 |
| TW | 201642355 A | 12/2016 |

* cited by examiner

[ FIG. 1 ]
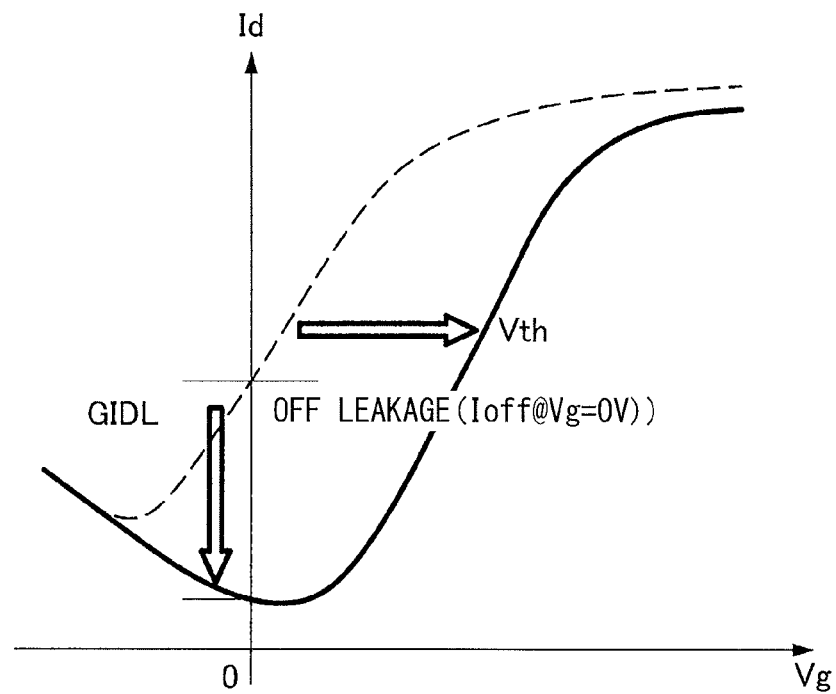
[ FIG. 2 ]
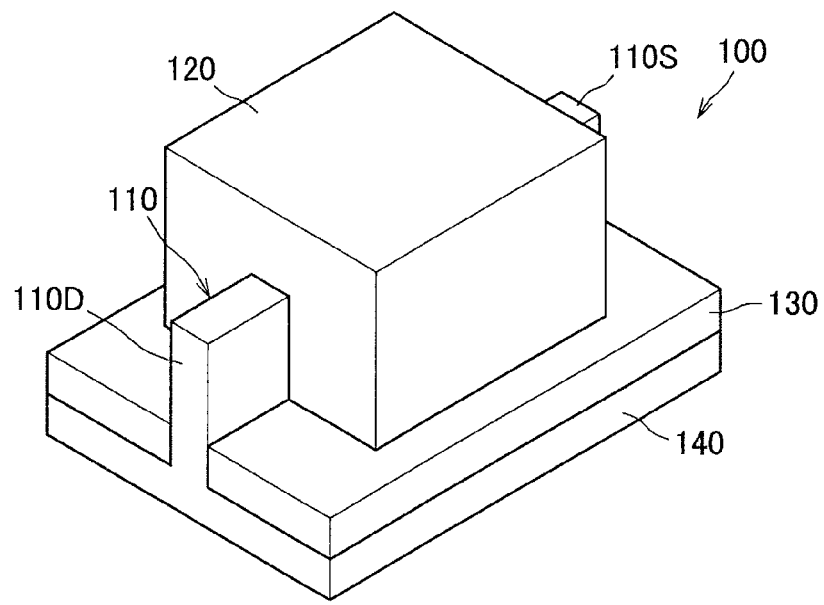

[ FIG. 3A ]
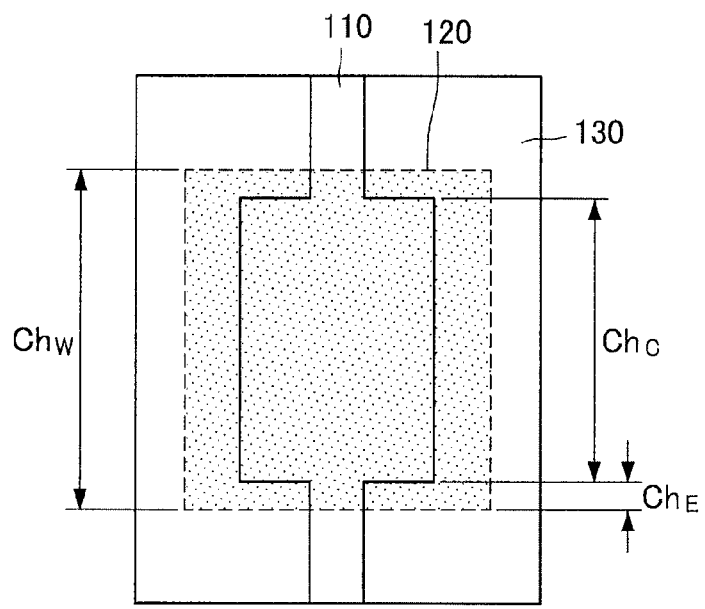
[ FIG. 3B ]
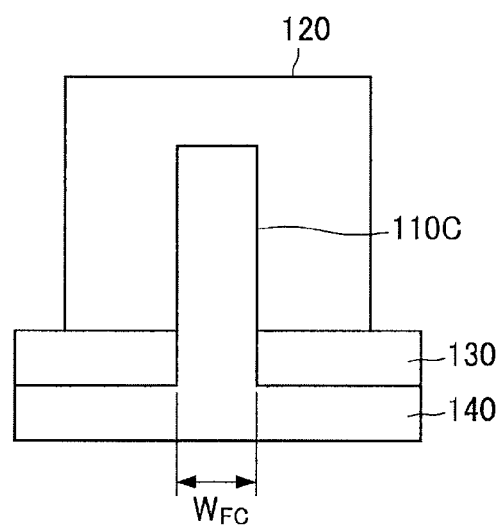

[ FIG. 3C ]
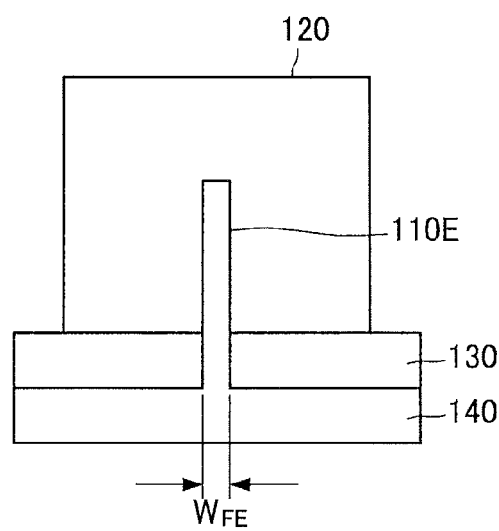
[ FIG. 4A ]
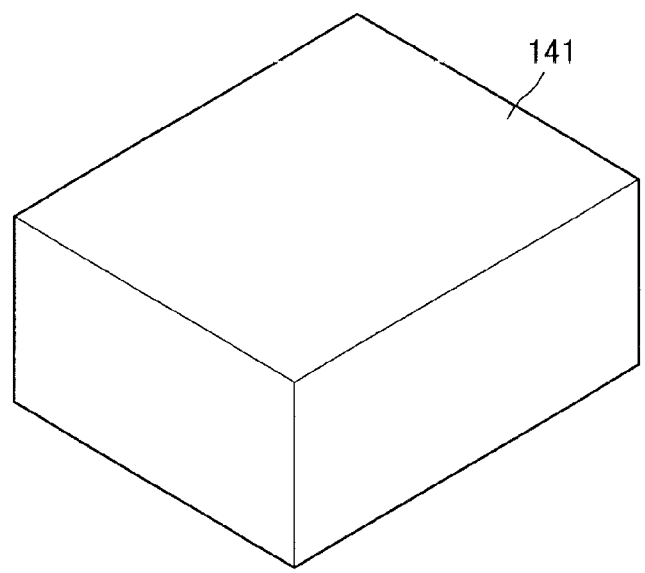

[ FIG. 4B ]
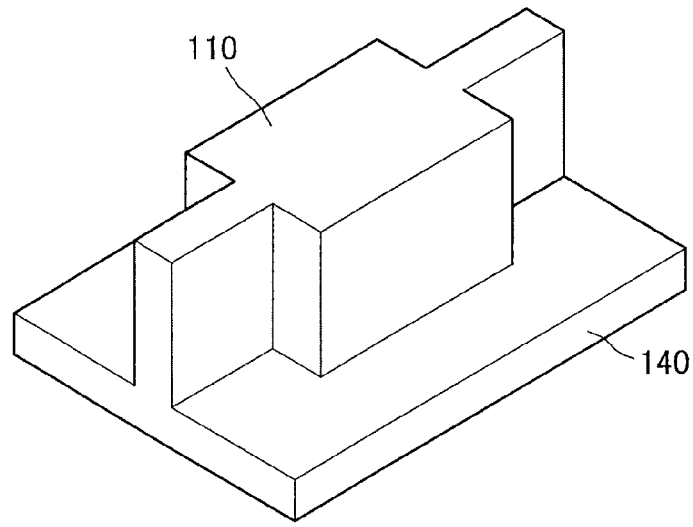
[ FIG. 4C ]
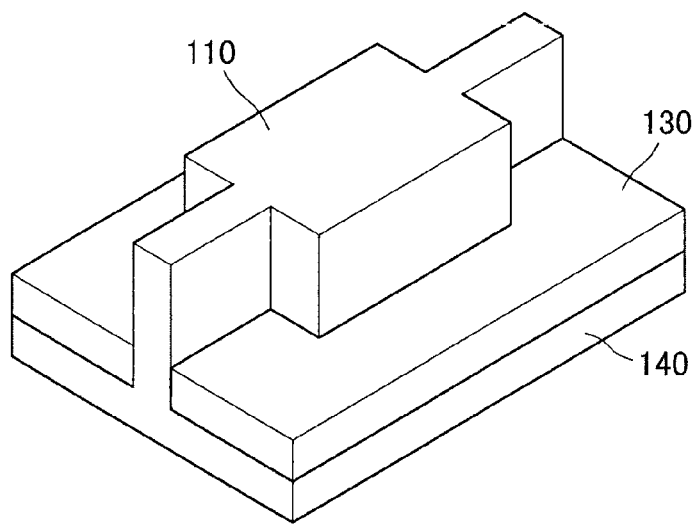

[ FIG. 4D ]
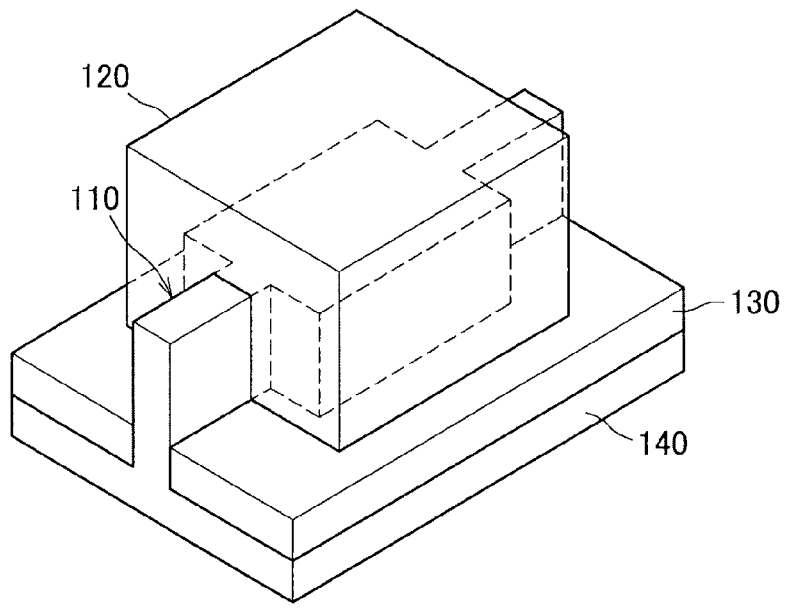
[ FIG. 5A ]
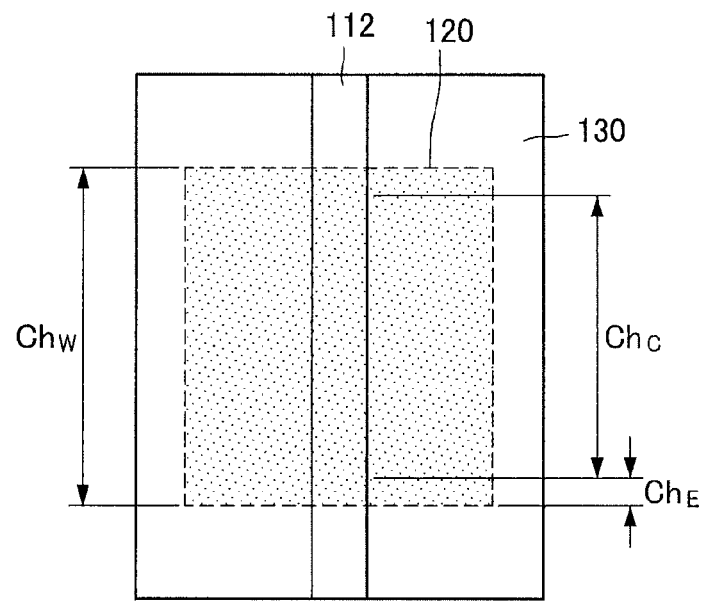

[ FIG. 5B ]
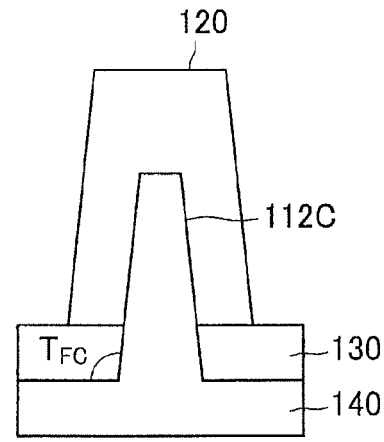
[ FIG. 5C ]
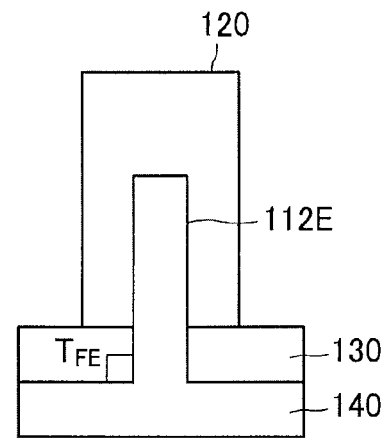
[ FIG. 6A ]
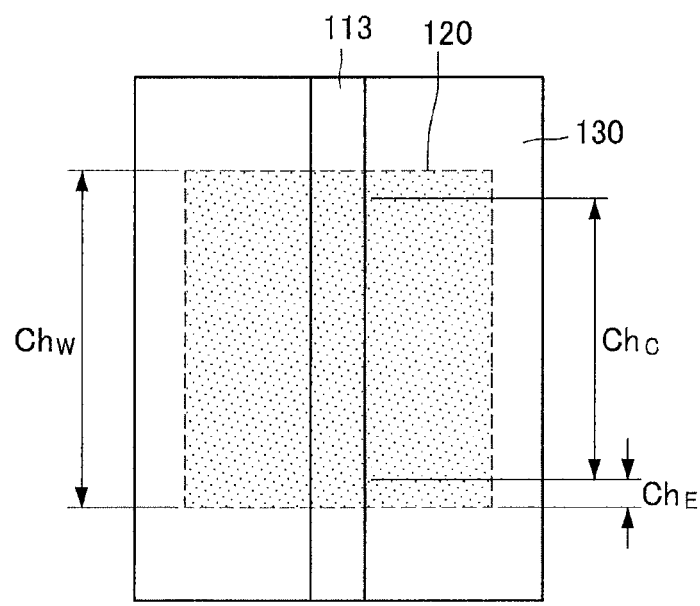

[ FIG. 6B ]
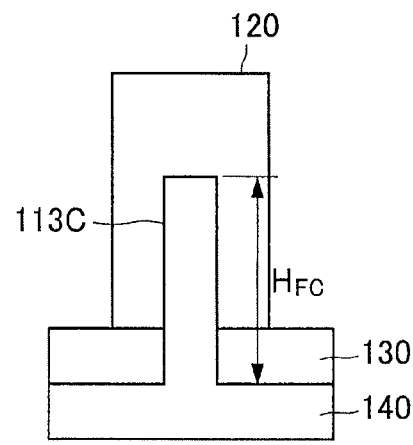
[ FIG. 6C ]
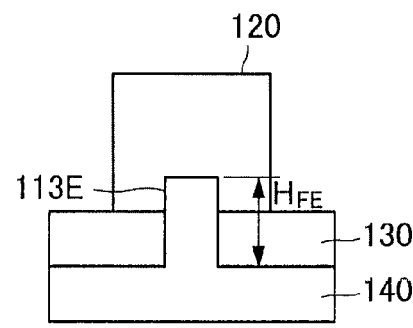
[ FIG. 7 ]
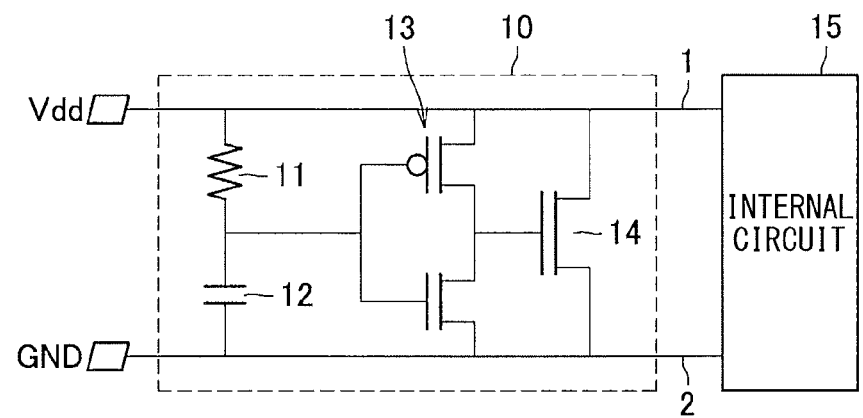

[ FIG. 8A ]
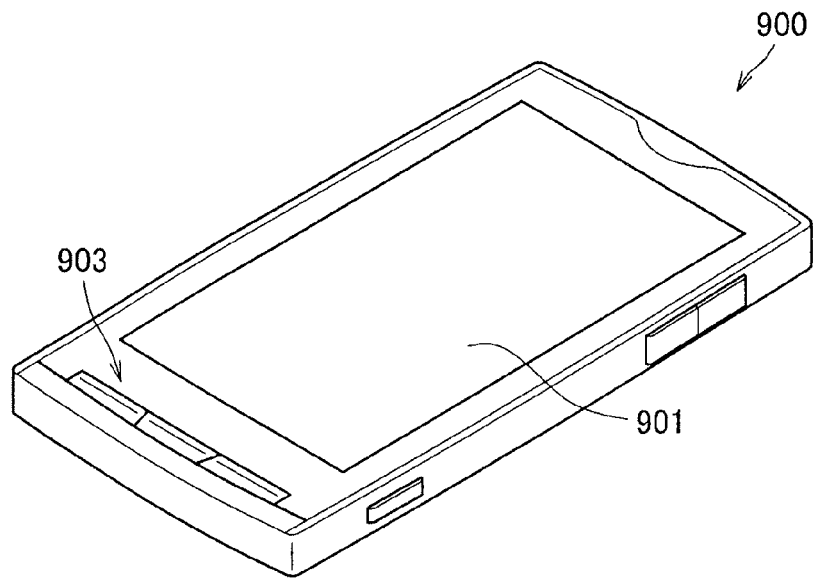
[ FIG. 8B ]
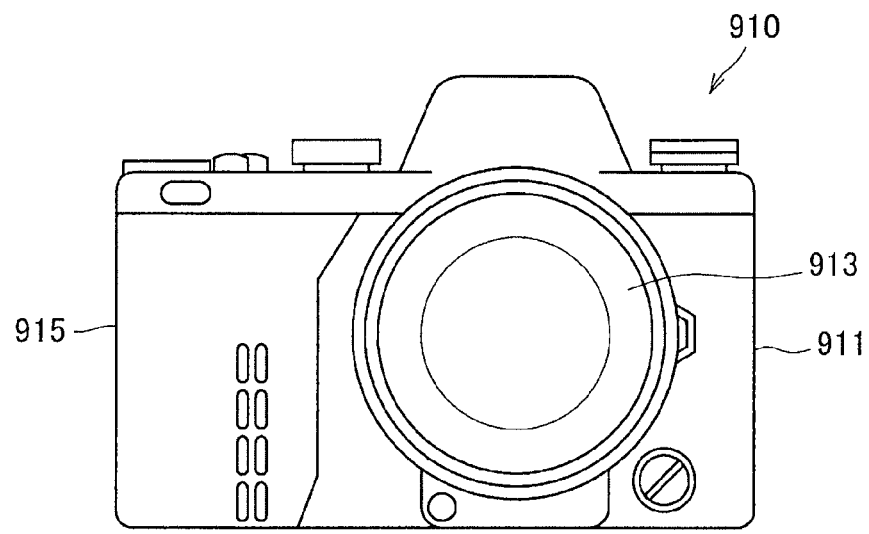

[ FIG. 8C ]
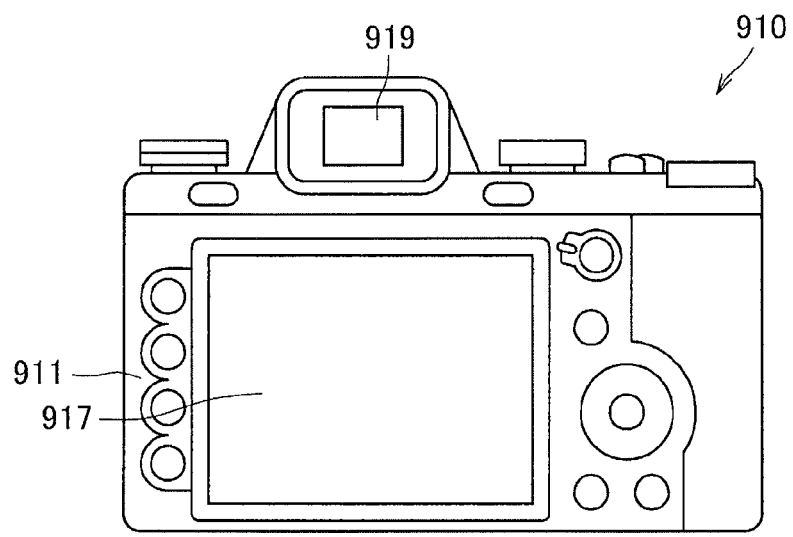

TRANSISTOR AND ELECTRONIC DEVICE

TECHNICAL FIELD

The present disclosure relates to a transistor and an electronic device.

BACKGROUND ART

Recently, field effect transistors in integrated circuits have exhibited higher performance and experienced die shrink.

On the other hand, it is difficult to stably control film thickness because typical planar transistors each have an extremely thin gate insulating film due to the die shrink. Moreover, transistors having reduced channel width due to the die shrink have stronger current (so-called "off state leakage current") flow therein in an off state because of a short channel effect.

Accordingly, a three-dimensional transistor is under development to achieve higher performance and further die shrink than the planar transistor does by forming the field effect transistor in a structure obtained by taking into account three-dimensional factors. Examples of such a three-dimensional transistor include a field effect transistor (FET) having a fin-shaped (plate-like) active region (so-called Fin-FET).

For example, PTL 1 described below discloses that using the Fin-FET is effective to achieve a high-performance LSI (Large Scale Integration) circuit, and discloses an ESD (electro-Static Discharge) protection element preferable for an LSI circuit including a Fin-FET. Moreover, according to PTL 1, transistor characteristics are controlled by controlling the amount of ion impurities introduced to a gate electrode of the transistor and controlling a work function of the gate electrode.

CITATION LIST

Patent Literature

PTL 1: Japanese Unexamined Patent Application Publication No. 2007-53316

SUMMARY OF THE INVENTION

Problems to be Solved by the Invention

However, in a case where such control of the work function of the gate electrode as disclosed in PTL 1 described above is performed in a state-of-the-art manufacturing process of a transistor and the like, another process for controlling the work function is required, which increases the number of processes and manufacturing cost.

A technology according to the present disclosure has been made in view of the above-described circumstances. The present disclosure proposes a novel and improved transistor and electronic device of which characteristics are more easily controlled.

Means for Solving the Problems

According to the present disclosure, there is provided a transistor including: a semiconductor substrate; an insulating layer provided on the semiconductor substrate; a semiconductor layer provided on the insulating layer in a protruding manner; and a gate electrode provided over a portion of the insulating layer on the semiconductor layer and the insulating layer. A middle portion of a channel region of the semiconductor layer covered by the gate electrode is provided in a shape different from a shape of at least one of ends of the channel region of the semiconductor layer.

In addition, according to the present disclosure, there is provided an electronic device including a circuit including a transistor including a semiconductor substrate, an insulating layer provided on the semiconductor substrate, a semiconductor layer provided on the insulating layer in a protruding manner, and a gate electrode provided over a portion of the insulating layer on the semiconductor layer and the insulating layer. A middle portion of a channel region of the semiconductor layer covered by the gate electrode is provided in a shape different from a shape of at least one of ends of the channel region of the semiconductor layer.

According to the present disclosure, it is possible to locally control threshold voltage and suppress increase in GIDL current while increasing the threshold voltage across the transistor by differentiating the shape of the semiconductor layer between the middle portion and the end of the channel region.

Effects of the Invention

As described above, according to the present disclosure, it is possible to more easily control transistor characteristics.

It is to be noted that the above-described effects are not necessarily limitative. Any of the effects indicated in this description or other effects that may be understood from this description may be exerted in addition to the above-described effects or in place of the above-described effects.

BRIEF DESCRIPTION OF DRAWING

FIG. 1 is a graph chart illustrating relationship between voltage applied to a gate electrode of a transistor and current flowing through a drain electrode of the transistor.

FIG. 2 is a schematic perspective view of a configuration of a transistor according to a first embodiment of the present disclosure.

FIG. 3A is a schematic transparent top view of the configuration of the transistor according to the embodiment.

FIG. 3B is a longitudinal cross-sectional view of the transistor according to the embodiment taken along a plane orthogonal to an extending direction of a semiconductor layer in a middle portion of a channel region.

FIG. 3C is a longitudinal cross-sectional view of the transistor according to the embodiment taken along a plane orthogonal to the extending direction of the semiconductor layer at an end of the channel region.

FIG. 4A is a schematic perspective view describing one process of a method of manufacturing the transistor according to the embodiment.

FIG. 4B is a schematic perspective view describing one process of the method of manufacturing the transistor according to the embodiment.

FIG. 4C is a schematic perspective view describing one process of the method of manufacturing the transistor according to the embodiment.

FIG. 4D is a schematic perspective view describing one process of the method of manufacturing the transistor according to the embodiment.

FIG. 5A is a schematic transparent top view of a configuration of a transistor according to a second embodiment of the present disclosure.

FIG. 5B is a longitudinal cross-sectional view of the transistor according to the embodiment taken along a plane orthogonal to an extending direction of a semiconductor layer in a middle portion of a channel region.

FIG. 5C is a longitudinal cross-sectional view of the transistor according to the embodiment taken along a plane orthogonal to the extending direction of the semiconductor layer at an end of the channel region.

FIG. 6A is a schematic transparent top view of a configuration of a transistor according to a third embodiment of the present disclosure.

FIG. 6B is a longitudinal cross-sectional view of the transistor according to the embodiment taken along a plane orthogonal to an extending direction of a semiconductor layer in a middle portion of a channel region.

FIG. 6C is a longitudinal cross-sectional view of the transistor according to the embodiment taken along a plane orthogonal to the extending direction of the semiconductor layer at an end of the channel region.

FIG. 7 is a circuit diagram illustrating an example of an ESD protection circuit to which the transistor according to each embodiment of the present disclosure is applicable.

FIG. 8A is an external view of an example of an electronic device to which the transistor according to each embodiment of the present disclosure is applicable.

FIG. 8B is an external view of an example of the electronic device to which the transistor according to each embodiment of the present disclosure is applicable.

FIG. 8C is an external view of an example of the electronic device to which the transistor according to each embodiment of the present disclosure is applicable.

MODES FOR CARRYING OUT THE INVENTION

The following describes a preferred embodiment of the present disclosure in detail with reference to the accompanying drawings. It is to be noted that, in this description and the accompanying drawings, components that have substantially the same functional configuration are indicated by the same reference signs, and thus redundant description thereof is omitted.

It is to be noted that, in each of the diagrams to be referred to for the following description, the size of some components may be exaggerated for the sake of explanation. The relative sizes of the components illustrated in each diagram thus do not necessarily represent the exact size relationships between the actual components. Moreover, in the following description, a direction in which a substrate or a layer is laminated may be referred to as upper direction.

It is to be noted that the description is given in the following order.
1. First Embodiment
1.1. Characteristics of Transistor
1.2. Configuration of Transistor
1.3. Method of Manufacturing Transistor
2. Second Embodiment
3. Third Embodiment
4. Application Examples
4.1. Application to ESD Protection Element
4.2. Application to Electronic Device
5. Conclusion

1. FIRST EMBODIMENT (1.1. Characteristics of Transistor)

First, with reference to FIG. 1, the characteristics of a transistor according to a first embodiment of the present disclosure. FIG. 1 is a graph chart illustrating relationship between voltage ($V_g$) applied to a gate electrode of a transistor and current ($I_d$) flowing through a drain electrode of the transistor.

In recent years, portable devices such as a smartphone, a tablet terminal, and a laptop have been widely spread. It is desired for these portable devices to reduce power consumption of various circuits to be mounted for extending operating time. For example, it is desired to further reduce leakage current (also referred to as "off current") flowing through the transistor in an off state.

Here, to reduce the off current of the transistor, for example, it is conceived to control threshold voltage ($V_{th}$) that is an operating threshold of the transistor. That is, as illustrated in FIG. 1, it is possible to reduce the off current ($I_{off}@V_g=0V$) by increasing the threshold voltage of the transistor.

Specifically, the threshold voltage ($V_{th}$) is derived from the following Expression 1.

[Expression 1]

$$V_{th}=V_{fb}+2\Psi_b+4\sqrt{(4\varepsilon_{si} \cdot q \cdot Na \cdot \Psi_b)/C_{ox}} \qquad \text{Expression 1}$$

In Expression 1, $V_{fb}$ is flat band voltage (V), and the second term ($2\Psi_b$) on the right side is difference between Fermi potential and real potential. ER is a dielectric constant of silicon, and q is charge (C). $N_a$ is impurity concentration ($m^{-3}$) of the semiconductor substrate on which the transistor is formed, and $C_{ox}$ is capacitance (F) of the gate insulating film.

Moreover, the flat band voltage ($V_{th}$) in Expression 1 is expressed by the following Expression 2.

[Expression 2]

$$V_{fb}=\Phi_g-\Phi_s+q/C_{ox} \qquad \text{Expression 2}$$

In Expression 2, $\Phi_g$ is a work function of the gate electrode, and $\Phi_s$ is a work function of the semiconductor substrate on which the transistor is formed.

According to Expression 1, it is found that increasing the flat band voltage $V_{fb}$ and the impurity concentration Na of the semiconductor substrate makes it possible to increase the threshold voltage ($V_{th}$) of the transistor and reduce the off current of the transistor. Moreover, according to Expression 2, it is found that increasing the work function $\Phi_g$ of the gate electrode makes it possible to increase the flat band voltage $V_{fb}$.

However, in a case where the work function $\Phi_g$ of the gate electrode is increased, the difference between the drain potential and the voltage applied to the gate electrode is also increased, suddenly changing an electric field in the channel. This increases gate induced drain leakage (GDIL) at the end of the gate electrode. Accordingly, to reduce the off current of the transistor, it is important to increase the threshold voltage ($V_{th}$) of the transistor and also suppress increase in the GDIL current.

The technology according to the present disclosure has been made in view of the above-described circumstances. The present disclosure provides the transistor with further reduced off current by increasing the threshold voltage of the transistor while suppressing the increase in the GIDL current.

(1.2. Configuration of Transistor)

In the following, a configuration of the transistor according to the present embodiment is described with reference to FIGS. 2 to 3C. FIG. 2 is a schematic perspective view of a configuration of a transistor according to the present embodiment.

As illustrated in FIG. 2, a transistor 100 according to the present embodiment includes a semiconductor substrate 140, an insulating layer 130, a semiconductor layer 110, and a gate electrode 120. The transistor 100 according to the present embodiment may have a so-called Fin-FET structure.

The semiconductor substrate 140 is a support having a circuit including the transistor 100. For example, the semiconductor substrate 140 may be a polycrystalline, monocrystalline, or amorphous silicon (Si) substrate. Alternatively, the semiconductor substrate 140 may be a so-called SOI (Silicon On Insulator) substrate having an insulating film of $SiO_2$ or the like held inside the above-described silicon substrate. Furthermore, the semiconductor substrate 140 may be, for example, a compound semiconductor substrate such as a gallium arsenide (GaAs) substrate, a gallium nitride (GaN) substrate, or another type of semiconductor substrate such as a silicon carbide (SiC) substrate, or it may be a substrate including a material other than semiconductor such as sapphire on which a film of silicon (Si) or the like is formed.

The insulating layer 130 is provided on the semiconductor substrate 140. Specifically, the insulating layer 130 includes an inorganic insulator, which may be inorganic oxide or inorganic nitride. For example, the insulating layer 130 may include silicon oxide ($SiO_x$), silicon nitride ($SiN_x$), silicon oxynitride (SiON), or the like, or may include aluminum oxide ($Al_2O_3$), titanium oxide ($TiO_2$), or the like. The insulating layer 130 may be formed by forming a film of the above-described inorganic oxide or the above-described inorganic nitride on the semiconductor substrate 140, or may be formed by oxidizing the semiconductor substrate 140 from the surface to a predetermined depth thereof.

The semiconductor layer 110 includes semiconductor, which is provided on the insulating layer 130 in a protruding manner. Specifically, the semiconductor layer 110 is provided on the insulating layer 130 in the shape of a plate or a bar extending in one direction. Although not illustrated in FIG. 2, the semiconductor layer 110 is provided in a channel region covered by the gate electrode 120 with a middle portion of the semiconductor layer 110 different in shape from an end of the semiconductor layer 110. This is described later in detail. For example, the semiconductor layer 110 may include silicon or the like with an n-type impurity (phosphorus, arsenic, or the like) or a p-type impurity (boron, aluminum, or the like) introduced therein to increase its electrical conductivity.

Here, the semiconductor layer 110 may include the same material as that of the semiconductor substrate 140 and may be provided by penetrating the insulating layer 130 and protruding from the semiconductor substrate 140. In such a case, it is possible to form the structure as illustrated in FIG. 2A by processing the semiconductor substrate 140 by etching or the like to form the semiconductor layer 110 vertically protruding, and then forming the insulating layer 130 on the semiconductor substrate 140. After the film of the semiconductor material is formed, this structure makes it possible to form the semiconductor layer 110 by digging into the semiconductor substrate 140 that supports the transistor 100 instead of forming the semiconductor layer 110 by etching. This makes it possible to simplify the manufacturing process of the transistor 100.

The gate electrode 120 is provided over a portion of the semiconductor layer 110 on the insulating layer 130. Specifically, the gate electrode 120 is provided over a portion of the semiconductor layer 110 to sandwich the semiconductor layer 110. That is, the gate electrode 120 is provided to cover the semiconductor layer 110 provided on the insulating layer 130 in a protruding manner along the shape of the semiconductor layer 110.

However, because the gate electrode 120 is provided only on a portion of the semiconductor layer 110, each end of the semiconductor layer 110 extending in one direction protrudes from the gate electrode 120. In the transistor 100 according to the present embodiment, the respective ends of the semiconductor layer 110 protruding from the gate electrode 120 function as a source region 110S and a drain region 110D. Moreover, the semiconductor layer 110 covered by the gate electrode 120 functions as the channel region, of which electrical conductivity is controlled by the voltage applied to the gate electrode 120. Therefore, although not illustrated, a source electrode is coupled to one end of the semiconductor layer 110 that functions as the source region 110S, and a drain electrode is coupled to the other end of the semiconductor layer 110 that functions as the drain region 110D.

For example, the gate electrode 120 may include polysilicon or the like, or may include metal such as titanium (Ti), molybdenum (Mo), tantalum (Ta), tungsten (W), niobium (Nb), nickel (Ni), zirconium (Zr), gold (Au), silver (Ag), aluminum (Al), or copper (Cu), or an alloy or a metal compound thereof. Alternatively, the gate electrode 120 may have a multilayer structure including multiple types of layers including the above-described materials laminated one on the other. Such a multilayer structure allows the gate electrode 120 to reduce wiring resistance and the like and control the work function more precisely.

It is to be noted that a gate insulating film (not illustrated) may be provided on the semiconductor layer 110 and the gate electrode 120 may be provided over the semiconductor layer 110 via the gate insulating film. The gate insulating film may include, for example, inorganic oxynitride such as silicon oxide ($SiO_x$), silicon nitride ($SiN_x$), or silicon oxynitride (SiON), or may include a dielectric material or a ferroelectric material such as hafnium oxide ($HfO_2$).

In a case where the gate insulating film is provided on the semiconductor layer 110, the transistor 100 functions as the so-called Fin-FET transistor, in which the semiconductor layer 110 near a surface provided with the gate insulating film functions as a channel. Moreover, in a case where the gate insulating film is not provided on the semiconductor layer 110, the transistor 100 functions as a so-called tri-gate or multi-gate transistor, in which the semiconductor layer 110 near three sides where the semiconductor layer 110 and the gate electrode 120 are in contact with each other functions as the channel.

Here, the shape of the semiconductor layer 110 in the channel region covered by the gate electrode 120 is described with reference to FIGS. 3A to 3C. FIG. 3A is a schematic transparent top view of a configuration of a transistor according to the present embodiment. FIG. 3B is a longitudinal cross-sectional view of the transistor 100 according to the embodiment taken along the plane orthogonal to the extending direction of the semiconductor layer 110 in a middle portion of a channel region. FIG. 3C is a longitudinal cross-sectional view of the transistor 100 according to the embodiment taken along the plane orthogonal to the extending direction of the semiconductor layer 110 at an end of a channel region.

As illustrated in FIG. 3A, assuming a region covered by the gate electrode 120 as a channel region, the semiconductor layer 110 has a shape in which the width of the middle portion of the channel region is larger than that of the end of the channel region. Specifically, assuming the width of a semiconductor layer 110C in the middle portion of the channel region illustrated in FIG. 3B as $W_{FC}$ and the width of a semiconductor layer 110E at the end of the channel region illustrated in FIG. 3C as $W_{FE}$, the semiconductor layer 110 is formed to have the $W_{FC}$ larger than $W_{FE}$.

Here, the end of the channel region of the semiconductor layer 110 represents a region where an equipotential surface extends from the source region 110S or the drain region 110D. In other words, the end of the channel region of the semiconductor layer 110 represents a region sized similarly to a region of an LDD (Lightly Doped Drain) in a planar transistor of the same generation.

For example, as illustrated in FIG. 3A, in a case where the length of the channel region (i.e., channel length) in the extending direction of the semiconductor layer 110 is represented as $Ch_W$, length $Ch_E$ of the end of the channel region of the semiconductor layer 110 corresponds to 5% to 15% of the length $Ch_W$. Accordingly, the end of the channel region of the semiconductor layer 110 represents a range of 5% to 15% of the length $Ch_W$ of the channel region from an edge of the channel region. More specifically, in a case where the length $Ch_W$ of the channel region in the extending direction of the semiconductor layer 110 is 300 nm, the length $Ch_E$ of the end of the channel region of the semiconductor layer 110 may be approximately 20 nm to 50 nm. In such a case, length $Ch_C$ of the middle portion of the channel region of the semiconductor layer 110 is about 200 nm to 260 nm obtained by subtracting $Ch_E \times 2$ from $Ch_W$.

In the present embodiment, because changing the shape of the semiconductor layer 110 makes it possible to change electric field distribution in the semiconductor layer 110 in the channel region, it is possible to change the threshold voltage ($V_{th}$) that is the operating threshold of the transistor 100. Specifically, it is possible to further increase the threshold voltage by increasing the width of the semiconductor layer 110. Accordingly, in the transistor 100, it is possible to increase the threshold voltage and reduce the leakage current (off current) in the off state by increasing the width of the middle portion of the semiconductor layer 110 that occupies a major portion of the channel region.

On the other hand, the width of the semiconductor layer 110 is smaller at the end of the channel region than the width of the semiconductor layer 110 in the middle portion of the channel region. Accordingly, when the end of the channel region is locally viewed, the threshold voltage of the transistor 100 is lower. Because this makes it possible to mitigate the difference between the drain potential and the voltage applied to the gate electrode 120 at the end of the channel region, the transistor 100 makes it possible to suppress the increase in the gate induced drain leakage (GIDL) current.

Thus, the transistor 100 according to the present embodiment makes it possible to reduce the off current while suppressing the increase in the GIDL current by differentiating the width of the semiconductor layer 110 between the middle portion and the end of the channel region. That is, the transistor 100 according to the present embodiment makes it possible to control the transistor to have desired characteristics by controlling the width of the semiconductor layer 110.

It is to be noted that, in the semiconductor layer 110 in the channel region, the end having the width smaller than that of the middle portion at least includes an end provided on the drain region 110D side. Because the GIDL current is generated on the drain region 110D side, the semiconductor layer 110 may have the same width at the end of the channel region on the source region 110S side as in the middle portion thereof. However, in a case where the end of the channel region on the source region 110S side and the end of the channel region on the drain region 110D side are shaped to be symmetric with each other, the manufacturing process is more simplified. Therefore, shaping both ends of the channel region of the semiconductor layer 110 to be symmetric with each other makes it possible to reduce manufacturing cost of the transistor 100.

To further improve the effects of reducing the off current while suppressing the increase in the GIDL current, the transistor 100 according to the present embodiment may use another method of changing the threshold voltage ($V_{th}$) of the transistor 100 in combination with the above-described method.

Specifically, it is also possible to control the threshold voltage (i.e., work function of the gate electrode 120) of the transistor 100 on the basis of the amount and polarity of impurities introduced into the semiconductor layer 110. Accordingly, it is also possible to reduce the off current while suppressing the increase in the GIDL current by inversing the polarity (p-type or n-type) of ion impurities to be introduced between the middle portion and the end of the semiconductor layer 110 in the channel region. For example, in a case of forming the transistor 100 as an n-type transistor, a p-type impurity such as boron is introduced into the entire semiconductor layer 110 and an n-type impurity such as phosphorus or arsenic is further introduced into the region corresponding to the middle portion of the semiconductor layer 110 in the channel region. Because this allows the transistor 100 to increase the threshold voltage while suppressing the increase in the GIDL current, it is possible to further reduce the off current.

Alternatively, it is also possible to control the threshold voltage (i.e., the work function of the gate electrode 120) of the transistor 100 on the basis of characteristics of the gate insulating film provided between the gate electrode 120 and the semiconductor layer 110. Accordingly, it is also possible to reduce the off current while suppressing the increase in the GIDL current by changing a material of the gate insulating film between the middle portion and the end of the semiconductor layer 110 in the channel region. For example, after a film of hafnium oxide ($HfO_2$) is formed on the semiconductor layer 110 as the gate insulating film, the gate insulating film is removed by etching or the like in the region corresponding to the middle portion of the semiconductor layer 110 in the channel region. Then, a film of titanium nitride (TiN) is formed in the region corresponding to the semiconductor layer 110 in the channel region as the gate insulating film. According to this, because the transistor 100 has different work functions for the gate between the middle portion and the end of the channel region, it is possible to increase the threshold voltage while suppressing the increase in the GIDL current. Therefore, the transistor 100 is allowed to further reduce the off current.

(1.3. Method of Manufacturing Transistor)

Next, a method of manufacturing the transistor 100 according to the present embodiment is described with reference to FIGS. 4A to 4D. Each of FIGS. 4A to 4D is a schematic perspective view describing one process of the method of manufacturing the transistor 100 according to the present embodiment.

In the following, the manufacturing method in a case where the transistor 100 is an n-type transistor is described. The manufacturing method in a case where the transistor 100 is a p-type transistor is substantially similar to the case of the n-type transistor, and description thereof is omitted here.

First, as illustrated in FIG. 4A, a silicon substrate is prepared as a semiconductor substrate 141.

Next, as illustrated in FIG. 4B, the semiconductor layer 110 is formed on the semiconductor substrate 140 by patterning the semiconductor substrate 141 using photolithography and etching.

Here, the semiconductor layer 110 is formed to cause the width of the semiconductor layer 110 corresponding to the middle portion of the channel region to be larger than the width of the semiconductor layer 110 corresponding to the end of the channel region because of formation of the gate electrode 120 in a later stage. As illustrated in FIG. 4B, the semiconductor layer 110 may be formed in the shape of a plate that extends in one direction with its middle portion projecting. For example, assuming the length ($Ch_W$) of the channel region in the direction in which the semiconductor layer 110 extends as 300 nm and the length ($Ch_E$) of the end of the channel region as 50 nm, the width ($W_{FC}$) of the semiconductor layer in the middle portion may be 56 nm and the width ($W_{FE}$) of the semiconductor layer at the end may be 7 nm.

Subsequently, as illustrated in FIG. 4C, the impurity is introduced into the semiconductor layer 110. For example, the semiconductor layer 110 may be doped with the p-type impurity such as boron at 5 kV/$1\times10^{13}$ cm$^{-2}$. Then, after the insulating layer 130 including silicon oxide ($SiO_2$) is formed on the whole surface of the semiconductor substrate 140, the region where the semiconductor layer 110 is formed is selectively etched, thereby exposing the semiconductor layer 110 to protrude from the insulating layer 130.

Furthermore, as illustrated in FIG. 4D, the gate electrode 120 is formed after the gate insulating film (not illustrated) of hafnium oxide ($HfO_2$) is formed on the semiconductor layer 110 in the channel region where the gate electrode 120 is to be formed. As the gate electrode 120, for example, a metallic material such as titanium (Ti), molybdenum (Mo), or tantalum (Ta) may be used.

It is then possible to form the transistor 100 according to the present embodiment by electrically coupling electrodes and wiring lines to respective terminals.

2. SECOND EMBODIMENT

Subsequently, the transistor 100 according to a second embodiment of the present disclosure is described with reference to FIGS. 5A to 5C. FIG. 5A is a schematic transparent top view of a configuration of a transistor according to the present embodiment. FIG. 5B is a longitudinal cross-sectional view of the transistor 100 according to the embodiment taken along the plane orthogonal to the extending direction of the semiconductor layer 112 in a middle portion of a channel region. FIG. 5C is a longitudinal cross-sectional view of the transistor 100 according to the embodiment taken along the plane orthogonal to the extending direction of the semiconductor layer 112 at one of the ends of a channel region.

In the channel region of the transistor 100 according to the present embodiment covered by the gate electrode 120, the middle portion of the semiconductor layer 112 has a shape different from that of the end of the semiconductor layer 112. Specifically, the semiconductor layer 112 is provided in a shape in which a taper in the middle portion of the channel region is larger than a taper at the end of the channel region. The configuration of the semiconductor layer 112 is substantially similar to the configuration described in the first embodiment except for the shape thereof, and description thereof is thus omitted here.

For example, assuming the inclination angle of a semiconductor layer 112C in the middle portion of the channel region illustrated in FIG. 5B as $T_{FC}$ and the inclination angle of a semiconductor layer 112E at the end of the channel region illustrated in FIG. 5C as $T_{FE}$, the semiconductor layer 112 is formed to have the $T_{FC}$ larger than $T_{FE}$. It is to be noted that, as illustrated in FIG. 5A, the width of the semiconductor layer 112 may be the same in the middle portion and at the end of the channel region.

Here, the definitions of the end of the channel region of the semiconductor layer 112 and the middle portion of the channel region of the semiconductor layer 112 are as described in the first embodiment. That is, the end of the channel region of the semiconductor layer 112 represents a region where an equipotential surface extends from the source region or the drain region.

For example, as illustrated in FIG. 5A, in a case where the length of the channel region (i.e., channel length) in the extending direction of the semiconductor layer 112 is represented as $Ch_W$, length $Ch_E$ of the end of the channel region of the semiconductor layer 112 corresponds to 5% to 15% of the length $Ch_W$. Accordingly, the end of the channel region of the semiconductor layer 112 represents a range of 5% to 15% of the length $Ch_W$ of the channel region from an edge of the channel region. More specifically, in a case where the length $Ch_W$ of the channel region in the extending direction of the semiconductor layer 112 is 300 nm, the length $Ch_E$ of the end of the channel region of the semiconductor layer 112 may be approximately 20 nm to 50 nm. In such a case, length $Ch_C$ of the middle portion of the channel region of the semiconductor layer 112 is about 200 nm to 260 nm obtained by subtracting $Ch_E \times 2$ from $Ch_W$.

In the present embodiment, because changing the shape of the semiconductor layer 112 makes it possible to change electric field distribution in the semiconductor layer 112 in the channel region, it is possible to change the threshold voltage ($V_{th}$) that is the operating threshold of the transistor 100. Specifically, it is possible to further increase the threshold voltage by increasing the inclination angle of the semiconductor layer 112. Accordingly, in the transistor 100, it is possible to increase the threshold voltage and reduce the leakage current (off current) in the off state by increasing the inclination angle of the middle portion of the semiconductor layer 112 that occupies a major portion of the channel region.

On the other hand, the inclination angle of the semiconductor layer 112 is smaller at the end of the channel region than the inclination angle of the semiconductor layer 112 in the middle portion of the channel region. Accordingly, when the end of the channel region is locally viewed, the threshold voltage of the transistor 100 is lower. Because this makes it possible to mitigate the difference between the drain potential and the voltage applied to the gate electrode 120 at the end of the channel region, the transistor 100 makes it possible to suppress the increase in the gate induced drain leakage (GIDL) current.

Thus, the transistor 100 according to the present embodiment makes it possible to reduce the off current while suppressing the increase in the GIDL current by differentiating the inclination angle of the semiconductor layer 112 between the middle portion and the end of the channel region. That is, the transistor 100 according to the present embodiment makes it possible to control the transistor to have desired characteristics by controlling the inclination angle of the semiconductor layer 110.

3. THIRD EMBODIMENT

Next, the transistor 100 according to a third embodiment of the present disclosure is described with reference to FIGS.

6A to 6C. FIG. 6A is a schematic transparent top view of a configuration of a transistor according to the present embodiment. FIG. 6B is a longitudinal cross-sectional view of the transistor 100 according to the embodiment taken along the plane orthogonal to the extending direction of the semiconductor layer 113 in a middle portion of a channel region. FIG. 6C is a longitudinal cross-sectional view of the transistor 100 according to the embodiment taken along the plane orthogonal to the extending direction of the semiconductor layer 113 at one of the ends of a channel region.

In the channel region of the transistor 100 according to the present embodiment covered by the gate electrode 120, the middle portion of the semiconductor layer 113 has a shape different from that of the end of the semiconductor layer 113. Specifically, the semiconductor layer 113 is provided in a shape in which the height of the middle portion of the channel region is larger than the height of the end of the channel region. The configuration of the semiconductor layer 113 is substantially similar to the configuration described in the first embodiment except for the shape thereof, and description thereof is thus omitted here.

For example, assuming the height of a semiconductor layer 113C in the middle portion of the channel region illustrated in FIG. 6B as $H_{FC}$ and the height of a semiconductor layer 113E at the end of the channel region illustrated in FIG. 6C as $H_{FE}$, the semiconductor layer 113 is formed to have the $H_{FC}$ larger than $H_{FE}$. The height of the semiconductor layer 113C and the height of the semiconductor layer 113E each represent height from the semiconductor substrate 140 in the vertical direction. It is to be noted that, as illustrated in FIG. 6A, the width of the semiconductor layer 113 may be the same in the middle portion and at the end of the channel region.

Here, the definitions of the end of the channel region of the semiconductor layer 113 and the middle portion of the channel region of the semiconductor layer 113 are as described in the first embodiment. That is, the end of the channel region of the semiconductor layer 113 represents a region where an equipotential surface extends from the source region or the drain region.

For example, as illustrated in FIG. 6A, in a case where the length of the channel region (i.e., channel length) in the extending direction of the semiconductor layer 113 is represented as $Ch_W$, length $Ch_E$ of the end of the channel region of the semiconductor layer 113 corresponds to 5% to 15% of the length $Ch_W$. Accordingly, the end of the channel region of the semiconductor layer 113 represents a range of 5% to 15% of the length $Ch_W$ of the channel region from an edge of the channel region. More specifically, in a case where the length $Ch_W$ of the channel region in the extending direction of the semiconductor layer 113 is 300 nm, the length $Ch_E$ of the end of the channel region of the semiconductor layer 113 may be approximately 20 nm to 50 nm. In such a case, length $Ch_C$ of the middle portion of the channel region of the semiconductor layer 113 is about 200 nm to 260 nm obtained by subtracting $Ch_E \times 2$ from $Ch_W$.

In the present embodiment, because changing the shape of the semiconductor layer 113 makes it possible to change electric field distribution in the semiconductor layer 113 in the channel region, it is possible to change the threshold voltage ($V_{th}$) that is the operating threshold of the transistor 100. Specifically, it is possible to further increase the threshold voltage by increasing the height of the semiconductor layer 113. Accordingly, in the transistor 100, it is possible to increase the threshold voltage and reduce the leakage current (off current) in the off state by increasing the height of the middle portion of the semiconductor layer 113 that occupies a major portion of the channel region.

On the other hand, the height of the semiconductor layer 113 is lower at the end of the channel region than the height of the semiconductor layer 113 in the middle portion of the channel region. Accordingly, when the end of the channel region is locally viewed, the threshold voltage of the transistor 100 is lower. Because this makes it possible to mitigate the difference between the drain potential and the voltage applied to the gate electrode 120 at the end of the channel region, the transistor 100 makes it possible to suppress the increase in the gate induced drain leakage (GIDL) current.

Thus, the transistor 100 according to the present embodiment makes it possible to reduce the off current while suppressing the increase in the GIDL current by differentiating the height of the semiconductor layer 113 between the middle portion and the end of the channel region. That is, the transistor 100 according to the present embodiment makes it possible to control the transistor to have desired characteristics by controlling the height of the semiconductor layer 113.

4. APPLICATION EXAMPLES (4.1. Application to ESD Protection Circuit)

The transistor 100 according to each embodiment of the present disclosure is applicable, for example, to a transistor in an ESD protection circuit that prevents static electricity (Electro-Static Discharge: ESD) from breaking an internal circuit. With reference to FIG. 7, an example of an ESD protection circuit to which the transistor 100 according to the present embodiment is applicable is described. FIG. 7 is a circuit diagram illustrating an example of an ESD protection circuit to which the transistor 100 according to the present embodiment is applicable.

As illustrated in FIG. 7, an ESD protection circuit 10 is a circuit for protecting an internal circuit 15 from ESD surge. The ESD protection circuit 10 includes a resistor 11, a capacitor 12, a CMOS inverter 13, and a clamp transistor 14 between a power line 1 and a ground line 2. It is to be noted that the power line 1 is supplied with power supply voltage Vdd. On the other hand, the ground line 2 reaches ground potential Vss by being coupled to a ground terminal.

The resistor 11 may be specifically a resistor or the like including a material such as polysilicon. For example, a gate electrode of a MOS transistor including polysilicon may be used as the resistor 11. It is possible to control a resistance value of the resistor 11 on the basis of the element size of the resistor 11.

The capacitor 12 may be specifically a capacitor having low bias dependency. For example, a capacitor using a gate insulating film of a MOS transistor as a dielectric, a capacitor using an insulating film between wiring layers as a dielectric, or the like may be used as the capacitor 12. It is possible to control a capacitance value of the capacitor 12 on the basis of the element size of the capacitor 12.

The resistance value of the resistor 11 and the capacitance value of the capacitor 12 are designed to make a time constant of an RC series circuit a desired value taking into account an application of the ESD protection circuit 10 and a model of assumed ESD surge current. The RC series circuit includes the resistor 11 and the capacitor 12. The resistance value of the resistor 11 may be appropriately designed in a range of 1000Ω to 10 MΩ, for example, and the resistance value of the capacitor 12 may be appropriately designed in a range of 1 pF to 10 pF, for example.

For example, in a case where an HBM (Human Body Model) is assumed as the model of the ESD surge current, the RC series circuit is designed to have a time constant of about 1µ as a guide. In such a case, setting 1 MΩ as the resistance value (R) of the resistor 11 and 1 pF as the capacitance value (C) of the capacitor 12 makes it possible to design the time constant of the RC series circuit as R×C=1 MΩ×1 pF=1 µ seconds.

At the CMOS inverter 13, potential (voltage signal) at a coupling point between the resistor 11 and the capacitor 12 is inputted and inverted input potential is outputted to a gate of the clamp transistor 14.

At the clamp transistor 14, a drain is coupled to the power line 1, a source is coupled to the ground line 2, and the gate is coupled to an output of the CMOS inverter 13. Consequently, On/Off control of the clamp transistor 14 is performed with the output signal (voltage signal) from the CMOS inverter 13. Moreover, the drain of the clamp transistor 14 is coupled to a well. It is to be noted that the clamp transistor 14 may include the transistor 100 according to the present embodiment.

Here, in a case where the ESD surge (high voltage pulse) is applied to the ESD protection circuit 10, through current flows through the RC series circuit including the resistor 11 and the capacitor 12 and a voltage level at an input terminal of the CMOS inverter 13 changes from "High" level to "Low" level. Here, the "High" level voltage signal inverted from the "Low" level is applied from an output terminal of the CMOS inverter 13 to the gate of the clamp transistor 14. Because this turns the clamp transistor 14 to the on state (conductive state), the ESD surge current flows between the drain and the source of the clamp transistor 14, and the ESD surge current is discharged to the ground line 2.

The above-described operations enable the ESD protection circuit 10 to protect the internal circuit 15 from the ESD surge current. The clamp transistor 14 included in the ESD protection circuit 10 turns to the on state in a case where the ESD surge current is generated, and thus retains the off state during standby. Consequently, applying the transistor 100 according to the present embodiment to the clamp transistor 14 to reduce the off current makes it possible to reduce the power consumption of the ESD protection circuit 10 during standby.

(4.2. Application to Electronic Device)

The transistor 100 according to each embodiment of the present disclosure is applicable as an element in a circuit to be mounted on each of various electronic devices. Subsequently, with reference to FIGS. 8A to 8C, an example of an electronic device to which the transistor 100 according to the present embodiment is applicable is described. Each of FIGS. 8A to 8C is an external view of an example of an electronic device to which the transistor 100 according to the present embodiment is applicable.

For example, the transistor 100 according to the present embodiment is applicable as an element in a circuit to be mounted on an electronic device such as a smartphone. Specifically, as illustrated in FIG. 8A, a smartphone 900 includes a display 901 that displays various types of information and an operating part 903 including a button or the like for receiving an input from a user. Here, the transistor 100 according to the present embodiment may be applied as the element in the control circuit for controlling various operations of the smartphone 900.

For example, the transistor 100 according to the present embodiment is applicable as an element in a circuit to be mounted on an electronic device such as a digital camera. Specifically, as illustrated in FIGS. 8B and 8C, a digital camera 910 includes a main body (camera body) 911, an interchangeable lens unit 913, a grip 915 to be gripped by the user at the time of photographing, a monitor 917 that displays various types of information, and an EVF (Electronic View Finder) 919 that displays a through image viewed by the user at the time of photographing. It is to be noted that FIG. 8B is an external view of the digital camera 910 as seen from the front side (i.e., from a subject side), and FIG. 8C is an external view of the digital camera 910 as seen from the back side (i.e. from a photographer side). Here, the transistor 100 according to the present embodiment may be applied as the element in the control circuit for controlling various operations of the digital camera 910.

It is to be noted that the electronic device to which the transistor 100 according to the present embodiment is applied is not limited to the above-described examples. The transistor 100 according to the present embodiment is applicable as an element in a circuit to be mounted on each of various electronic devices. Examples of such an electronic device include a glass-shaped wearable device, an HMD (Head Mounted Display), a television apparatus, an electronic book, a PDA (Personal Digital Assistant), a notebook personal computer, a video camera, a gaming console, or the like.

5. CONCLUSION

As described above, the transistor 100 according to an embodiment of the present disclosure makes it possible to increase the threshold voltage across the transistor 100 while suppressing the increase in the GIDL current by differentiating the shape of the semiconductor layer 110 between the middle portion and the end of the channel region. Therefore, that is, the transistor 100 according to the present embodiment makes it possible to obtain desired transistor characteristics to reduce the off current by controlling the shape of the semiconductor layer 110.

It is also possible to implement the first to third embodiments described above by combining at least two or more of them. In such a case, the semiconductor layer 110 is provided to cause the volume of the middle portion of the channel region of the semiconductor layer 110 to be larger than the volume of the end of the channel region of the semiconductor layer 110. Because this allows the transistor 100 to further increase the threshold voltage of the transistor 100 while suppressing the increase in the GIDL current, it is possible to further reduce the off current.

A preferred embodiment(s) of the present disclosure has/have been described above in detail with reference to the accompanying drawings, but the technical scope of the present disclosure is not limited to such an embodiment(s). It is apparent that a person having ordinary skill in the art of the present disclosure may arrive at various alterations and modifications within the scope of the technical idea described in the appended claims, and it is understood that such alterations and modifications naturally fall within the technical scope of the present disclosure.

Furthermore, the effects described herein are merely illustrative and exemplary, and not limitative. That is, the technique according to the present disclosure may exert other effects that are apparent to those skilled in the art from the description herein, in addition to the above-described effects or in place of the above-described effects.

It is to be noted that the following configurations are also fall within the technical scope of the present disclosure.

(1)
A transistor including:
a semiconductor substrate;
an insulating layer provided on the semiconductor substrate;
a semiconductor layer provided on the insulating layer in a protruding manner; and a gate electrode provided over a portion of the insulating layer on the semiconductor layer and the insulating layer,
a middle portion of a channel region of the semiconductor layer covered by the gate electrode being provided in a shape different from a shape of at least one of ends of the channel region of the semiconductor layer.

(2)
The transistor according to (1), in which the middle portion of the channel region of the semiconductor layer is provided in a shape in which the middle portion of the channel region of the semiconductor layer has a volume larger than a volume of one of the ends of the channel region of the semiconductor layer.

(3)
The transistor according to (2), in which the middle portion of the channel region of the semiconductor layer is provided in a shape in which the middle portion of the channel region of the semiconductor layer has a width larger than a width of the at least one of the ends of the channel region of the semiconductor layer.

(4)
The transistor according to (2), in which the middle portion of the channel region of the semiconductor layer is provided in a shape in which the middle portion of the channel region of the semiconductor layer has a taper larger than a taper of the at least one of the ends of the channel region of the semiconductor layer.

(5)
The transistor according to (2), in which the middle portion of the channel region of the semiconductor layer is provided in a shape in which a height of the middle portion of the channel region of the semiconductor layer protruding from the semiconductor substrate is larger than a height of the at least one of the ends of the channel region of the semiconductor layer.

(6)
The transistor according to any one of (1) to (5), in which an ion impurity is introduced to the semiconductor layer, and polarity of an ion impurity introduced to the middle portion of the channel region of the semiconductor layer is different from polarity of an ion impurity introduced to an end of the channel region of the semiconductor layer.

(7)
The transistor according to any one of (1) to (6), in which the gate electrode is provided on the semiconductor layer via a gate insulating film provided on the semiconductor layer.

(8)
The transistor according to any one of (1) to (7), in which the semiconductor layer is provided by penetrating the insulating layer and protruding from the semiconductor substrate.

(9)
The transistor according to any one of (1) to (8), in which a source electrode or a drain electrode is coupled to the semiconductor layer protruding from the channel region.

(10)
The transistor according to (9), in which at least one of ends provided in a shape different from a shape of the middle portion on the semiconductor layer includes an end on a side to which the drain electrode is coupled.

(11)
The transistor according to any one of (1) to (10), in which the transistor is provided to a circuit included in a protection element.

(12)
An electronic device including
a circuit including a transistor including a semiconductor substrate, an insulating layer provided on the semiconductor substrate, a semiconductor layer provided on the insulating layer in a protruding manner, and a gate electrode provided over a portion of the insulating layer on the semiconductor layer and the insulating layer, a middle portion of a channel region of the semiconductor layer covered by the gate electrode being provided in a shape different from a shape of at least one of ends of the channel region of the semiconductor layer.

REFERENCE SIGNS LIST

1: Power line
2: Ground line
10: Protection circuit
11: Resistor
12: Capacitor
13: Inverter
14: Clamp transistor
15: Internal circuit
100: Transistor
110: Semiconductor layer
110D: Drain region
110S: Source region
120: Gate electrode
130: Insulating layer
140: Semiconductor substrate

The invention claimed is:
1. A transistor comprising:
a semiconductor substrate;
a semiconductor layer extending above an upper surface of the semiconductor substrate, the semiconductor layer including a channel region with a middle portion and end portions respectively extending from the middle portion in a channel length direction, the middle portion being formed in a shape different from a shape of the end portions, the middle portion being larger than the respective end portions in at least one dimension, a total volume of the middle portion being larger than a total volume of each of the respective end portions;
an insulating layer formed on the upper surface of the semiconductor substrate, the insulating layer being in contact with the upper surface of the semiconductor substrate and in contact with portions of sidewalls of the middle portion and the end portions, the middle portion and the end portions protruding above the insulating layer; and
a gate structure formed over at least a portion of the channel region of the semiconductor layer and over and in contact with at least a portion of the insulating layer,
wherein the middle portion of the channel region has a first width at the surface of the semiconductor substrate, and a second width at an upper surface, the first width being larger than the second width, such that the middle portion has a taper in a cross section along a channel width direction, the taper of the middle portion being larger than a taper of the end portions.

2. The transistor according to claim 1, wherein
an ion impurity is introduced to the semiconductor layer, and
polarity of an ion impurity introduced to the middle portion of the channel region of the semiconductor layer is different from polarity of an ion impurity introduced to the end portions of the channel region of the semiconductor layer.

3. The transistor according to claim 1, wherein the gate structure includes a gate electrode is provided on the semiconductor layer via a gate insulating film provided on the semiconductor layer.

4. The transistor according to claim 1, wherein a source electrode or a drain electrode is coupled to the semiconductor layer protruding from the channel region.

5. The transistor according to claim 4, wherein at least one of the end portions has an end on a side to which the drain electrode is coupled.

6. The transistor according to claim 1, wherein the transistor is included in a circuit that is included in a protection element.

7. An electronic device comprising the transistor according to claim 1.

8. The electronic device according to claim 7, wherein
an ion impurity is introduced to the semiconductor layer, and
polarity of an ion impurity introduced to the middle portion of the channel region of the semiconductor layer is different from polarity of an ion impurity introduced to the end portions of the channel region of the semiconductor layer.

9. The electronic device according to claim 7, wherein the gate structure includes a gate electrode provided on the semiconductor layer via a gate insulating film provided on the semiconductor layer.

10. The electronic device according to claim 7, wherein a source electrode or a drain electrode is coupled to the semiconductor layer protruding from the channel region.

11. The electronic device according to claim 10, wherein at least one of the end portions has an end on a side to which the drain electrode is coupled.

12. The electronic device according to claim 7, wherein the transistor is included in a circuit that is included in a protection element.

* * * * *